(12) United States Patent
Yang

(10) Patent No.: US 6,756,664 B2
(45) Date of Patent: Jun. 29, 2004

(54) NOISE ELIMINATING SYSTEM ON CHIP AND METHOD OF MAKING SAME

(75) Inventor: Chih An Yang, Hsin Tien (TW)

(73) Assignee: VIA Technologies, Inc., Taipei Hsien (TW)

(*) Notice: Subject to any disclaimer, the term of this patent is extended or adjusted under 35 U.S.C. 154(b) by 0 days.

(21) Appl. No.: 10/407,231

(22) Filed: Apr. 7, 2003

(65) Prior Publication Data
US 2004/0099934 A1 May 27, 2004

(30) Foreign Application Priority Data
Nov. 22, 2002 (TW) ........................... 91134103 A

(51) Int. Cl.[7] ........................................... A01L 23/52
(52) U.S. Cl. ......................................... 257/691; 257/724
(58) Field of Search ................................ 257/691, 723, 257/724, 659, 307, 516, 777; 438/109, 110

(56) References Cited

U.S. PATENT DOCUMENTS

| 5,808,878 | A | * | 9/1998 | Saito et al. |
| 5,869,894 | A | * | 2/1999 | Degani et al. |
| 6,181,008 | B1 | * | 1/2001 | Avery et al. |
| 6,184,585 | B1 | * | 2/2001 | Martinez et al. |
| 6,222,246 | B1 | * | 4/2001 | Mak et al. |
| 6,222,278 | B1 | * | 4/2001 | Muyamoto et al. |
| 6,424,034 | B1 | * | 7/2002 | Ahn et al. |
| 6,489,686 | B2 | * | 12/2002 | Farooq et al. |

* cited by examiner

Primary Examiner—Sheila V. Clark
(74) Attorney, Agent, or Firm—Birch, Stewart, Kolasch & Birch, LLP

(57) ABSTRACT

A noise eliminating system on chip and method of fabricating the same are provided. A noise eliminating system is connected to a chip. There are guiding units provided on the chip for connecting with the noise eliminating system, thereby reducing simultaneous switching noise of the chip.

14 Claims, 6 Drawing Sheets

NOISE ELIMINATING SYSTEM ON CHIP AND METHOD OF MAKING SAME

This nonprovisional application claims priority under 35 U.S.C. §119(a) on Patent Application No(s). 091134103 filed in TAIWAN on Nov. 22, 2002, which is (are) herein incorporated by reference.

BACKGROUND OF THE INVENTION

1. Field of the Invention

The present invention relates to a packaged chip or die with a noise-suppressing system. More particularly, the present invention relates to a noise-suppressing system, which is electrically connected to a chip, capable of reducing or eliminating excess noise.

2. Description of the Prior Art

Please refer to FIG. 1. FIG. 1 illustrates a cross section of a conventional leadframe package structure 10 mounted on a printed circuit board 11. The printed circuit board 11 comprises an upper surface 12 and a lower surface 13. For a four-layer printed circuit board 11, the upper surface 12 and the lower surface 13 may be one of the power supply layer, grounded layer, signal layer, or device layer. Passive components 14 and 15 are mounted on either upper surface 12 or lower surface 13 by surface mount technology (SMT) known in the art. For example, the passive components 14 and 15 may be de-coupling capacitors used to reduce or eliminate undesired coupling between circuits or simultaneous switching noise (SSN) between the power supply layer and the grounded layer of a high-frequency circuit.

Please refer to FIG. 2. FIG. 2 is a cross-sectional view of a prior art ball grid array (BGA) package 20. As shown in FIG. 2, a trace 22 is provided in a substrate 21 of the BGA package 20. A chip 23 is mounted on the substrate 21 and is connected with the trace 22 of the substrate 21 via a wire bonding 24. A passive component 14 is mounted on an upper surface of the substrate 21 by SMT. The chip 23 and the passive component 14 on the substrate 21 are encapsulated with encapsulant 25. Again, the passive component 14 may be a de-coupling capacitor used to reduce or eliminate undesired coupling between circuits or SSN between the power supply layer and the grounded layer of a high-frequency circuit.

Typically, the de-coupling capacitor is preferably mounted in the proximity of the chip 23 to enhance the performance of the de-coupling capacitor to reduce SSN of the chip 23. However, as the prior art examples shown in FIG. 1 and FIG. 2, the chip 23 and the de-coupling capacitor (s) are rested on the substrate 21 or the printed circuit board 11. In such case, referring to FIG. 3, the efficiency of the de-coupling capacitor is reduced by the accumulated inductance and resistance in the coupling path. This causes a significant performance reducing of the de-coupling capacitor. Further, with reference to FIG. 1, in practice, the passive components 14 and 15 occupy a portion of the area of the upper surface 12 or the lower surface 13 of the printed circuit board 11. With reference to FIG. 2, the passive component 14 is disposed on the substrate 21. Under the above-described circumstance, when the number of the passive components 14 and 15 increases, there will be no more capacity for additional bonding route or other devices on the printed circuit board 11 or on the substrate 21. In other words, the prior art packaging geometry limits the possibility of shrinking the dimension of the printed circuit board 11 or the substrate 21.

Thus, there is a strong need for an improved chip package, which is reliable, cost-effective and is capable of effectively eliminating SSN.

SUMMARY OF THE INVENTION

Accordingly, the main object of the invention is to provide an improved chip package in combination with a noise-eliminating system and a fabrication method thereof to solve the above-mentioned problems. The noise eliminating system is mounted on the upper surface of the chip, such that the noise eliminating system can approach the power supply unit and the grounding unit as close as possible, thereby enhancing the performance of the passive component.

Another object of the present invention is to provide a noise eliminating system on chip and method of making the same to minimize the number of devices needed to be installed between the chip and the noise eliminating system, thereby decreasing accumulated impedance caused by high-frequency circuit between the chip and the noise eliminating system, thereby enhancing the performance of the passive component.

Still another object of the present invention is to provide a noise eliminating system on chip and method of making the same, in which the noise eliminating system is directly mounted on the upper surface of the chip, thereby saving a great deal of substrate space and making it possible to shrink the size of the printed circuit board or the substrate, and thus reduce the cost.

To achieve the above goals, a noise eliminating system on chip and method of fabricating the same are provided. A noise eliminating system is connected to a chip. There are guiding units provided on the chip for connecting with the noise eliminating system, thereby reducing simultaneous switching noise of the chip.

According to one aspect of this invention, a noise eliminating system on chip is provided. The noise eliminating system on chip comprises a chip; a power supply unit provided on the chip and being electrically connected to the chip; a grounding unit provided on the chip and being electrically connected to the chip; a guiding unit installed on an upper surface of the chip and being electrically connected to the power supply unit and the grounding unit; and at least one noise eliminating system comprising a connecting unit and a noise eliminating unit, wherein the connecting unit is electrically connected to the noise eliminating unit, and wherein the connecting unit is electrically connected to the guiding unit.

According to one aspect of this invention, a method for fabricating a noise eliminating system on chip, which comprises the steps of:

providing a chip having thereon a power supply unit and a grounding unit;

forming a guiding device layer on an upper surface of the chip;

etching the guiding device layer to form the guiding devices;

providing a noise eliminating system;

using surface mount technology to install the noise eliminating system on the upper surface of the chip, and the noise eliminating system connects to the guiding devices; and jointing the junction between the noise eliminating system and the guiding devices such that the noise eliminating system is electrically connected to the guiding devices.

Other objects, advantages and novel features of the invention will become more clearly and readily apparent from the following detailed description when taken in conjunction with the accompanying drawings.

DETAILED DESCRIPTION OF THE PREFERRED EMBODIMENTS

Figure 1:
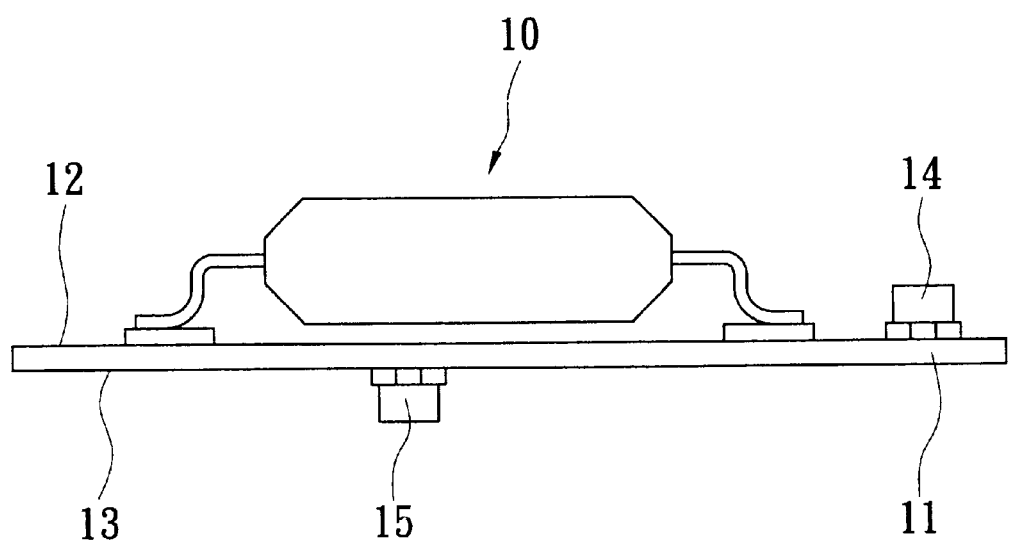
FIG. 1 illustrates a cross section of a conventional leadframe package structure mounted on a printed circuit board.
Figure 2:
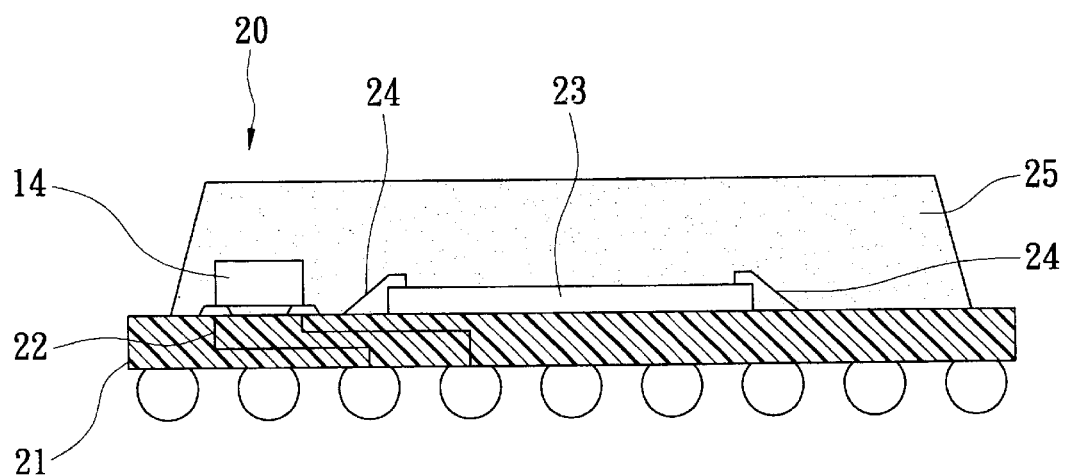
FIG. 2 is a cross-sectional view of a prior art ball grid array (BGA) package.
Figure 3:
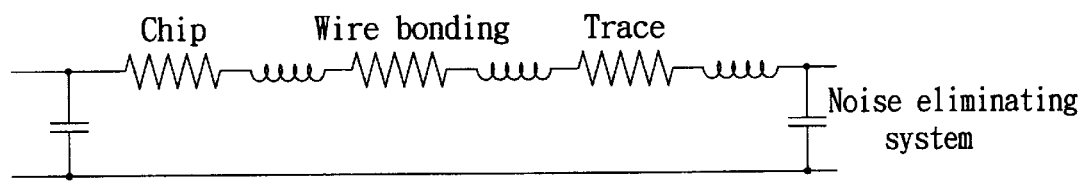
FIG. 3 illustrates the simultaneous switching noise (SSN) accumulated from the chip, the wire bonding, and the trace.
Figure 4:
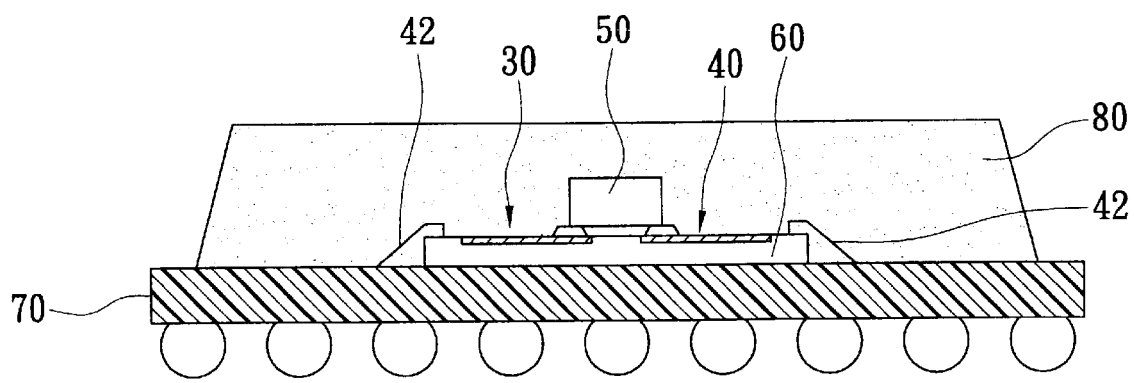
FIG. 4 is a cross-sectional diagram illustrating the BGA package according to the present invention.
Figure 5:
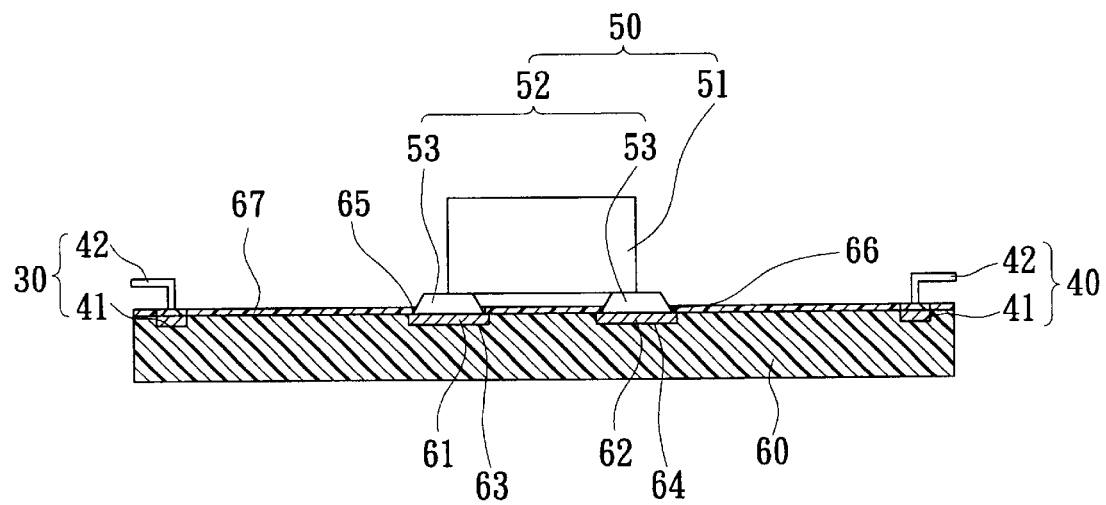
FIG. 5 is a cross sectional view of this invention.
Figure 6:
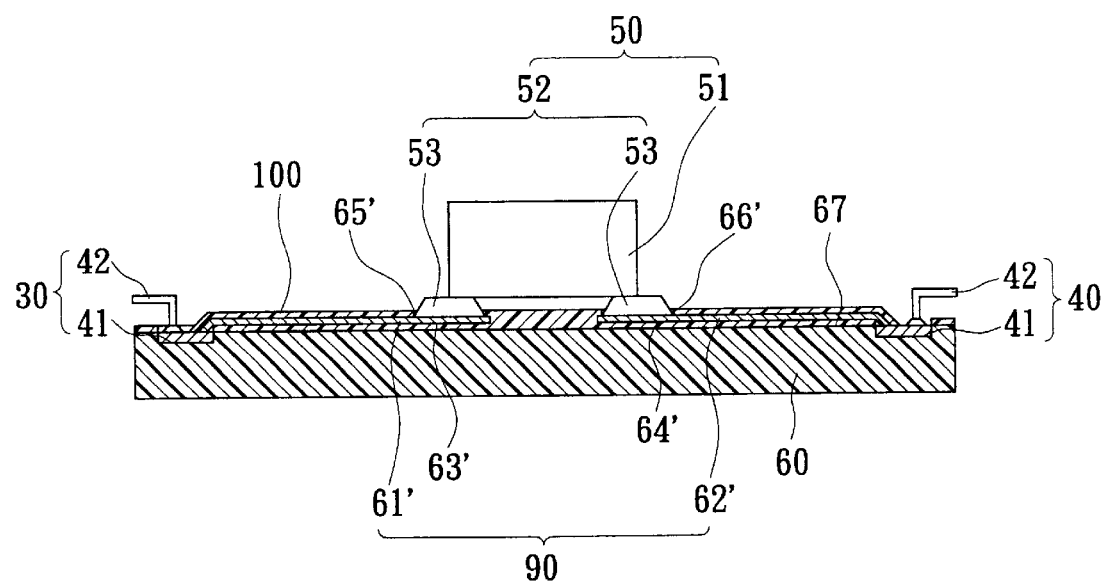
FIG. 6 is a cross sectional view of this invention.

Please refer to FIG. 4 to FIG. 6. The present invention is directed to chip package in combination with a noise eliminating system and a fabrication method thereof. As shown in FIG. 4, power supply unit 30, grounding unit 40, and noise eliminating system 50 are directly disposed on the chip 60 and electrically connected to each other, such that the noise eliminating system 50 can eliminate undesired coupling between circuits or SSN between the power supply layer and the grounded layer of a high-frequency circuit in a more effective way. Such chip 60 with the noise eliminating system 50 directly built thereon is then mounted on a substrate 70. Necessary electric connection is provided. Finally, the chip 60 with the noise eliminating system 50 is packaged on the substrate 70 by using encapsulant 80.

As shown in FIG. 4 to FIG. 6, in the chip 60, the power supply unit 30 and the grounding unit 40 are provided. Both of the power supply unit 30 and the grounding unit 40 have corresponding bonding pads 41 and wire bonds 42. The bonding pads 41 are disposed on the chip 60 and electrically connected to each other. The wire bonds 42, which are electrically connected to conductive traces (not shown) on the substrate 70, are soldered on the corresponding bonding pads 41.

As best seen in FIG. 5, in accordance with the first preferred embodiment of this invention, a first guiding device 61 and a second guiding device 62 are installed in the chip 60. The first guiding device 61 is installed in a first region 63 in the chip 60 and the second guiding device 62 is installed in the second region 64 in the chip 60, where the first and second regions 63 and 64 are connected with outer environment. The first guiding device 61 is connected to the bonding pad 41 of the power supply unit 30 and the second guiding device 62 is connected to the bonding pad 41 of the grounding unit 40 (not shown). On the upper surface 67 of the chip 60 there is provided a protection layer. A first guiding device opening 65 and a second guiding device opening 66 are formed in the protection layer, wherein the first guiding device opening 65 is connected to the first guiding device 61 in the first region 63, and the second guiding device opening 66 is connected to the second guiding device 62 in the second region 64, wherein the first region 63 and the second region 64 are located on the chip 60, such that the first and second guiding devices 61 and 62 are connected to outer environment. The noise eliminating system 50 comprises connecting unit 51 and noise eliminating unit 52 and both are electrically connected to each other. The connecting unit 51 comprises two connecting ports 53, which are respectively protrude from the first guiding device openings 65 and 66 and are respectively connected to the first guiding device 61 in the first region 63 and the second guiding device 62 in the second region 64. The noise eliminating system 50 may be a passive component such as a de-coupling capacitor, and the above-described guiding devices 61 and 62 are inner circuits of the chip 60. The power supply unit 30, the grounding unit 40, and the noise eliminating system 50 can be installed at one side of the chip 60.

As best seen in FIG. 6, in accordance with the second preferred embodiment of this invention, a noise eliminating system 50 and an additional guiding unit 90 are installed on the upper surface 67 of the chip 60. The guiding unit 90 comprises a first guiding device 61' and a second guiding device 62', which are respectively located in the first region 63' and second region 64' of the chip 60. The first guiding device 61' is electrically connected to the bonding pad 41 of the power supply unit 30 and the second guiding device 62' is electrically connected to the bonding pad 41 of the grounding unit 40. A protection layer 100 is provided over the guiding devices 61' and 62' and over the chip 60. A first guiding device opening 65' and a second guiding device opening 66' are formed in the protection layer 100. The first guiding device opening 65' and the second guiding device opening 66' correspond to the first guiding device 61' in the first region 63' and the second guiding device 62' in the second region 64', respectively. The first and second regions 63' and 64' are located on the chip 60. The connecting unit 51 of the noise eliminating unit 52 comprises two connecting ports 53, which respectively protrude from the first and second guiding device openings 65' and 66', and are electrically connected to the first guiding device 61' in the first region 63' and the second guiding device 62' in the second region 64', respectively. The above-described guiding devices 61' and 62' may be circuit, and the noise eliminating system 50 may be a de-coupling capacitor.

As shown in FIG. 4, a chip 60 in combination with a noise eliminating system 50 is installed on a ball grid array (BGA) substrate 70. The substrate 70 comprises conductive traces (not shown) connecting to respective power supply and grounding. The power supply unit 30 and the grounding unit 40 of the chip 60 are electrically connected to the power trace and the grounding trace of the substrate 70 through the wire bonding 42. The chip 60 with the noise eliminating system 50 is encapsulated on the substrate 70 with encapsulant 80. Preferably, the guiding device 90 is a metal redistribution layer.

Figure 7:
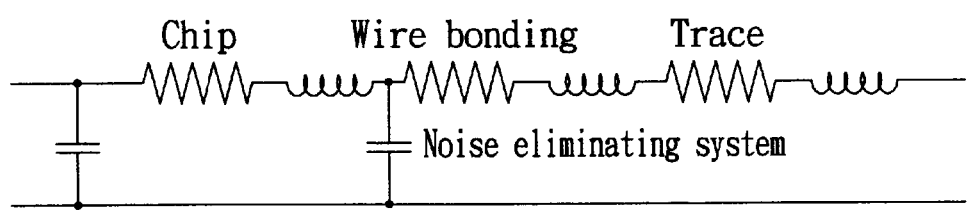
FIG. 7 is a circuit diagram of this invention.

FIG. 7 illustrates an equivalent circuit showing the noise eliminating system 50 on chip 60. The simultaneous switching noise (SSN) caused by rapid switching between the wire bonding 42 and the trace of the substrate 70 is eliminated.

In accordance with the present invention, a method for fabricating the noise eliminating system on chip comprising the steps of:

providing a chip having a grounding unit and a power supply unit;

forming a guiding layer on the upper surface of the chip;

etching the guiding layer to form the guiding devices;

providing a noise eliminating system;

using surface mount technology to install the noise eliminating system on the upper surface of the chip, and the noise eliminating system connects to the guiding devices; and jointing the junction between the noise eliminating system and the guiding devices such that the noise eliminating system is electrically connected to the guiding devices.

The guiding layer is made of conductive materials sputtered on the upper surface of the chip and is selectively etched away to form a plurality of guiding devices.

To sum up, the present invention has the following advantages:

1. The noise eliminating system is directly installed on the chip and is electrically connected to the chip, thereby shrinking the connecting distance between the chip and the noise eliminating system.

2. The simultaneous switching noise (SSN) is effectively eliminated.

3. The number of devices that are needed on the substrate or printed circuit board is reduced, such that the size of the substrate or printed circuit board is shrinkable, thereby reducing cost.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A noise eliminating system on chip, comprising:
   a chip;
   a power supply unit provided on the chip and being electrically connected to the chip;
   a grounding unit provided on the chip and being electrically connected to the chip;
   a guiding unit installed on an upper surface of the chip and being electrically connected to the power supply unit and the grounding unit; and
   at least one noise eliminating system comprising a connecting unit and a noise eliminating unit, wherein the connecting unit is electrically connected to the noise eliminating unit, and wherein the connecting unit is electrically connected to the guiding unit.

2. The noise eliminating system on chip as claimed in claim 1 wherein a protection layer is provided on the guiding unit and the chip, and a guiding unit opening is provided at the joint between the guiding unit and the connecting unit of the noise eliminating system.

3. The noise eliminating system on chip as claimed in claim 1 wherein the guiding unit comprises at least one first guiding device and at least one second guiding device, which are installed in a first region and second region of the chip respectively, and wherein the first guiding device is electrically connected to the power supply unit and the second guiding device is electrically connected to the grounding unit.

4. The noise eliminating system on chip as claimed in claim 3 wherein the a first guiding device opening e and a second guiding device opening corresponding to the first guiding device in the first region and the second guiding device in the second region respectively are provided in the protection layer that covers the guiding unit and the chip.

5. The noise eliminating system on chip as claimed in claim 4 wherein the connecting unit of the noise eliminating system comprises two connecting ports which protrude through respective first and second guiding openings to electrically connect to the first and second guiding devices.

6. The noise eliminating system on chip as claimed in claim 3 wherein the first and second regions are located on the chip.

7. The noise eliminating system on chip as claimed in claim 3 wherein the guiding device is a circuit.

8. The noise eliminating system on chip as claimed in claim 1 wherein the noise eliminating system is a passive component.

9. The noise eliminating system on chip as claimed in claim 1 wherein the noise eliminating system is a de-coupling capacitor.

10. A method for fabricating a noise eliminating system on chip, comprising the steps of:
    providing a chip having thereon a power supply unit and a grounding unit;
    forming a guiding device layer on an upper surface of the chip;
    etching the guiding device layer to form the guiding devices;
    providing a noise eliminating system;
    using surface mount technology to install the noise eliminating system on the upper surface of the chip, and the noise eliminating system connects to the guiding devices; and
    jointing the junction between the noise eliminating system and the guiding devices such that the noise eliminating system is electrically connected to the guiding devices.

11. The method for fabricating a noise eliminating system on chip as claimed in claim 10 wherein the guiding device layer is made of conductive material sputtered on the upper surface of the chip.

12. The method for fabricating a noise eliminating system on chip as claimed in claim 10 wherein the noise eliminating system is a passive component.

13. The method for fabricating a noise eliminating system on chip as claimed in claim 10 wherein the noise eliminating system is a de-coupling capacitor.

14. The method for fabricating a noise eliminating system on chip as claimed in claim 10 wherein the guiding devices are circuit layers inside the chip.

* * * * *